(12) United States Patent
Wang et al.

(10) Patent No.: US 8,178,930 B2
(45) Date of Patent: May 15, 2012

(54) STRUCTURE TO IMPROVE MOS TRANSISTOR ON-BREAKDOWN VOLTAGE

(75) Inventors: Shen-Ping Wang, Keelung (TW);
Tsung-Yi Huang, Hsin-Chu (TW);
Wen-Liang Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 115 days.

(21) Appl. No.: 11/714,569

(22) Filed: Mar. 6, 2007

(65) Prior Publication Data
US 2008/0217693 A1    Sep. 11, 2008

(51) Int. Cl.
*H01L 29/94* (2006.01)
(52) U.S. Cl. .. 257/371; 257/344; 257/408; 257/E29.258
(58) Field of Classification Search .................. 257/344, 257/345, 408, E29.258, 371
See application file for complete search history.

(56) References Cited

U.S. PATENT DOCUMENTS

| | | | |
|---|---|---|---|
| 5,362,982 A | 11/1994 | Hirase et al. | |
| 5,602,048 A | 2/1997 | Komori et al. | |
| 5,721,170 A * | 2/1998 | Bergemont | 438/303 |
| 5,736,416 A | 4/1998 | Johansson | |
| 5,877,044 A | 3/1999 | Neilson et al. | |
| 6,063,673 A | 5/2000 | Kao et al. | |
| 6,144,068 A | 11/2000 | Kao et al. | |
| 6,667,512 B1 | 12/2003 | Huster et al. | |
| 6,690,060 B2 * | 2/2004 | Horiuchi et al. | 257/327 |
| 6,861,704 B2 * | 3/2005 | Asada et al. | 257/336 |
| 7,433,051 B2 | 10/2008 | Owen | |
| 2001/0035557 A1 * | 11/2001 | Park et al. | 257/371 |
| 2002/0070413 A1 * | 6/2002 | Takeuchi et al. | 257/408 |
| 2003/0042548 A1 * | 3/2003 | Maeda et al. | 257/369 |
| 2006/0081925 A1 * | 4/2006 | Wang et al. | 257/344 |
| 2008/0029830 A1 | 2/2008 | Tsai et al. | |

FOREIGN PATENT DOCUMENTS

| | | |
|---|---|---|
| CN | 1198003 | 11/1998 |
| CN | 1397987 A | 2/2003 |
| CN | 1862828 A | 11/2006 |
| EP | 0481559 A2 | 4/1992 |

* cited by examiner

*Primary Examiner* — Howard Weiss
*Assistant Examiner* — Tifney Skyles
(74) *Attorney, Agent, or Firm* — Slater & Matsil, L.L.P.

(57) ABSTRACT

A novel MOS transistor structure and methods of making the same are provided. The structure includes a MOS transistor formed on a semiconductor substrate of a first conductivity type with a plug region of first conductivity type formed in the drain extension region of second conductivity type (in the case of a high voltage MOS transistor) or in the lightly doped drain (LDD) region of second conductivity type (in the case of a low voltage MOS transistor). Such structure leads to higher on-breakdown voltage. The inventive principle applies to MOS transistors formed on bulky semiconductor substrate and MOS transistors formed in silicon-on-insulator configuration.

21 Claims, 28 Drawing Sheets

STRUCTURE TO IMPROVE MOS TRANSISTOR ON-BREAKDOWN VOLTAGE

TECHNICAL FIELD

The present invention relates generally to structures of high voltage transistors and methods of making the same. More particularly, this invention relates to structures for high voltage NMOS transistors, wherein a P-type implant region is formed in the N-type drain extension region to suppress hot-carrier effects and improve on-breakdown voltage, and methods of fabricating the same. The inventive feature is also applicable to high voltage PMOS transistors and low voltage short channel logical MOS devices.

BACKGROUND

Electric breakdown in MOS devices is a well recognized problem. The breakdown phenomena escalates when the space between the source and drain region continues to narrow in MOS transistors made by advanced processing technology, stemming from increased electric fields in the channel region. As appreciated by those skilled in the art, the mechanism of the breakdown phenomena in a MOS transistor includes junction breakdown, punchthrough breakdown and snapback breakdown. Junction breakdown occurs due to abrupt doping profile changes between the highly doped N+ drain region and P type substrate, and can be prevented, for example, by forming an NMOS device on a lightly doped P type substrate. Punchthrough breakdown happens when the drain and source depletion regions meet under the channel when the reverse-bias voltage on the drain/substrate junction is increased. In the case of an NMOS transistor, punchthrough breakdown can be suppressed by local implant (halo implant) of highly concentrated P-type impurity deep under the channel region on the side wall of the N+ drain/P-substrate, N+ source/P-substrate junctions. Snapback breakdown in an NMOS transistor occurs near the drain region during saturated operation (transistor is turned on). When a voltage is applied on the drain, a lateral electric field is presented in the channel region of the transistor and the peak electric field occurs near the drain region. The high electric field accelerates the electrons in the channel region and causes the electrons to gain enough kinetic energy to become "hot" near the edge of the N+ drain region. The "hot" electrons cause impact ionization of materials near the drain edge and create electron-hole pairs. Electrons will inject into the gate oxide due to positive bias on the gate electrode, while holes inject into the substrate. Some of these holes are collected by the source and this hole current positively biases the substrate/source junction, which in turn causes more electrons being pulled out from the source region, accelerated and injected into the drain region. These electrons, in turn, cause more impact ionization near the drain and create more electron-hole pairs. When this positive-feedback mechanism starts in the substrate, the substrate acts much like an NPN BJT device working under forward-active mode, where the forward biased substrate-to-source junction (base-to-emitter junction) causes large current to be injected into the P-type substrate (base). The current is amplified in the substrate region (base) and collected by the drain (collector) through the reverse biased drain-to-substrate junction (collector-to-base junction). Snapback breakdown is a type of avalanche breakdown. When it happens in a MOS device, large current is created in the substrate and voltage applied on the gate electrode loses control over the current flow in the channel region, which causes a MOS device stop to functioning. Furthermore, the electrons injected into the gate oxide may cause negative effects, such as Vt shift and reliability degradation, among others. Under severe situations, snapback breakdown may cause permanent physical damage in the gate oxide.

FIG. 1A shows a section view of a prior art high voltage MOS (HVMOS) transistor 10. Transistor 10 has a typical structure of a lateral power MOSFET for high-voltage applications, namely for the automobile industry, portable telecommunication devices, medical equipment, display drivers, and other areas which call for high reliability and compactness. In transistor 10, a lightly doped N− region 12 is formed as an extension of the highly doped N+ drain region 14 of an NMOS transistor. The lightly doped N− region 12 is called N-extension region or N-drift region. The N-extension region 12 formed between the P-type channel and the N+ drain region 14 results in a more graded N-type impurity profile, which improves the drain-to-substrate junction breakdown voltage under the N+ drain area. Thick field oxide 11 is formed over N-extension region 12 and a portion of gate 13 is formed along the upper edge of thick field oxide 11. The thick field oxide 11 is applied to protect the gate 13 from high electrical field on the drain side, which causes "hot carrier" injection into the gate oxide 15. The N-extension region 12 under field oxide 11 between the N+ drain and gate 13 will absorb some voltage applied on the drain when the device is under saturated operation (device is ON) and reduce the peak electric field near the N+ drain edge. This, in turn, will improve the snapback breakdown (on-breakdown) voltage near the drain edge. However, the thick field oxide 11 of this prior art structure causes the transistor 10 to have undesirably large device dimensions, which makes HVMOS devices with this type of structure unfavorable for being integrated with low voltage MOS (LVMOS) devices of small device dimensions on a same chip, as required by many applications.

FIG. 1B illustrates the structure of another previously known HVMOS transistor 20, which is integrated with its low voltage counterparts on a same substrate for HV applications such as source driver of LCD monitors, among others. This prior art structure includes an N-extension region 21A on the source side and an N− extension region 21B on the drain side. The double-diffused drain and source region of this prior art structure reduce the peak electric field in the channel region, and in turn, can sustain higher Vd applied on the drain 24. Transistor 20 also includes a thick gate dielectric 25 which is about four to five times thicker than that of a low voltage MOS transistor (LVMOS), in order to sustain higher Vg applied on gate electrode 23. However, further HV applications push the supply voltages of current on-chip HVMOS devices to even higher limit, which demands improved on-breakdown voltages in existing on-chip HVMOS devices, due to increased electric field in the conducting channel.

Shown in FIG. 1C is a widely recognized structure of a low voltage short channel NMOS transistor 30, which reduces snapback breakdown near the drain 34 edge by forming a lightly doped N-section 35 of the drain (LDD) at the edge near the channel. The LDD region 35 between the channel and the N+ drain region 34 absorbs some of the voltage applied on the drain when the device is in operational mode and attenuates the electric field near the N+ drain edge to a value below the critical ionization field, which, in turn, reduces "hot carrier" injection into the gate oxide. However, as recognized by those skilled in the art, as MOS transistor channel spacing decreases, the peak electric field at the N+ drain edge increases significantly. Therefore, the LDD technique will reach its own limit where the peak electric field at the N+ drain edge exceeds the critical value and triggers the catastrophic avalanche breakdown.

In view of these and other problems in the prior efforts to reduce the on-breakdown and suppress the on-breakdown effects, there is a need for improved or new MOS transistor structures, which improve on-breakdown voltage and reduce "hot-carrier" degradation, and methods of fabricating the same, in order to cope with the continuing scaling down of device dimensions.

SUMMARY OF THE INVENTION

These and other problems are generally solved or circumvented, and technical advantages are generally achieved, by preferred embodiments of the present invention which provide a MOS transistor formed on a semiconductor substrate of a first conductivity type with a plug region of first conductivity type formed in the drain extension region of second conductivity type (in the case of an HVMOS transistor) or in the lightly doped drain (LDD) region of second conductivity type (in the case of a LVMOS transistor).

In accordance with a preferred embodiment of the present invention, an HVMOS transistor comprises a substrate of first conductivity type, a source region and a drain region of second conductivity type, a gate dielectric layer, a gate layer, a field oxide region and a lightly doped plug region of first conductivity type. The drain region comprises a relatively lightly doped region contiguous with a relatively heavily doped region. The lightly doped plug region comprises a portion extending into the substrate and is surrounded by the lightly doped drain region and contiguous with the heavily doped drain region. An advantage of the preferred embodiment is that carriers in the conducing channel must bypass the non-conductive plug region in order to reach heavily doped drain contact region. When a voltage is applied on the drain contact, the increased conductive path in accordance with the preferred embodiments will result in weaker peak electric field near the drain contact region, which in turn, leads to higher on-breakdown voltage when the transistor is under the same operating condition of a prior art HVMOS transistor. This inventive principle applies to both HVMOS and LVMOS transistors.

The inventive principle also applies to MOS transistor formed in a semiconductor layer atop an insulating material layer, in a so-called silicon-on-insulator (SOI) wafer configuration.

The present invention also includes methods of making the preferred embodiments of HVMOS and LVMOS transistors using standard CMOS and BiCMOS processes. The method of making the preferred embodiment of HVMOS comprises: providing a semiconductor substrate having a surface region of a first conductivity type; doping source and drain extension regions in said surface region with dopant of a second conductivity type; forming a gate dielectric layer on a portion of said surface region and forming a gate electrode on said gate dielectric layer; and selectively implanting dopant of said first conductivity type in said drain extension region, in a concentration greater than the concentration of dopant of said second conductivity type in said drain extension regions in said surface region, to a depth less than that of said drain extension regions.

The method of making the preferred embodiment of LVMOS comprises: providing a semiconductor substrate having a surface region of a first conductivity type; forming a gate dielectric layer on a portion of said surface region and forming a gate electrode on said gate dielectric layer; forming lightly doped drain region in said surface region with dopant of a second conductivity type; selectively implanting dopant of said first conductivity type in said lightly doped drain region, in a concentration greater that of said lightly doped source and drain regions, to a depth less than that of said lightly doped drain region; forming a first dielectric spacer on the side wall of said gate dielectric layer and said gate electrode; and forming source and drain contact regions by selectively implanting dopant of said second conductivity type in said source and drain regions in a concentration greater than the concentration of dopant of said first and said second conductivity type in said lightly doped drain in said surface region, to a depth greater than that of said lightly doped drain region.

The present invention also includes a method of making the preferred embodiments in a semiconductor layer atop an insulating material layer, in a so-called silicon-on-insulator (SOI) wafer configuration, which comprises: providing a substrate of insulating material; forming a semiconductor layer of a first conductivity type over said insulating material; forming a gate dielectric layer on a portion of said semiconductor layer and forming a gate electrode on said gate dielectric layer; forming lightly doped source and drain regions in said semiconductor layer with dopant of a second conductivity type; selectively implanting dopant of said first conductivity type in said lightly doped drain region, in a concentration greater that of said lightly doped drain region, to a depth less than that of said lightly doped drain region; forming a first dielectric spacer on the side wall of said gate dielectric layer and said gate electrode; and forming source and drain contact regions by selectively implanting dopant of said second conductivity type in said source and drain regions in a concentration greater than the concentration of dopant of said first and said second conductivity type in said lightly doped drain in said semiconductor layer, to a depth greater than that of said lightly doped drain region.

In making the preferred embodiments, forming the lightly doped plug region is conducted by the same mask leveled in forming the lightly doped source/drain regions, heavily doped source/drain regions in a conventional MOS transistor. Making the inventive transistor structure without additional mask level offers great cost advantage.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a novel structure to increase the on-breakdown voltage of a high voltage MOS transistor (HVMOS) and the method of forming the same. The invention may also be applied, however, to low voltage MOS transistors or other semiconductor devices where a solution for improving on-breakdown voltage is needed.

Figure 2A:
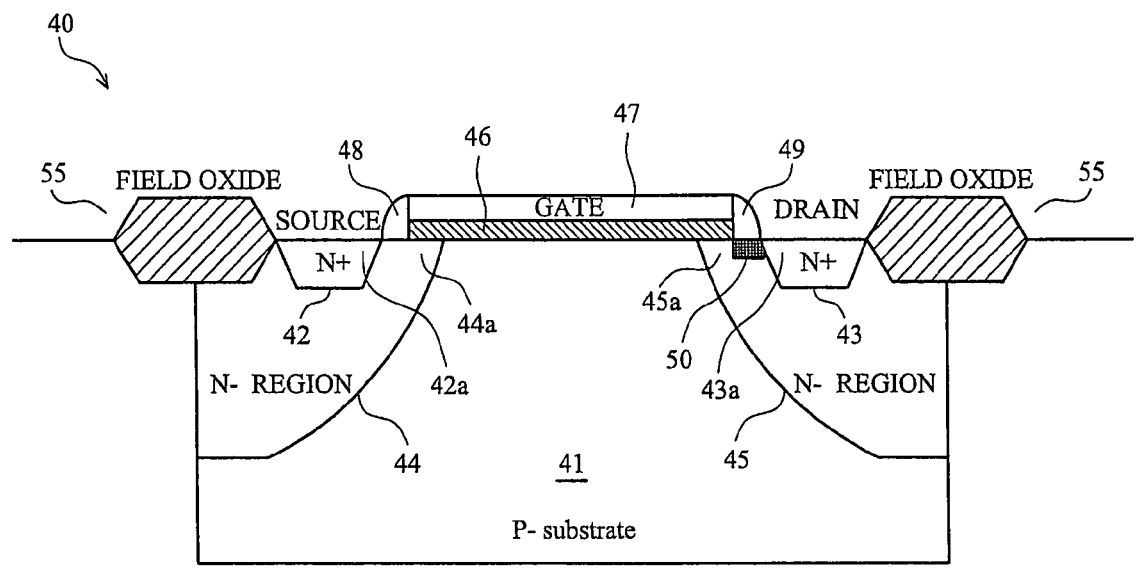
FIG. 2A is a cross-sectional view of an illustrative embodiment of a high voltage NMOS transistor with a P-type implant in an N-type drain extension region.

In a preferred embodiment shown in FIG. 2A, an N-channel enhanced mode, high voltage MOS transistor 40 comprises a bulk substrate 41 of P-type monocrystalline silicon having a low dopant concentration from approximately $10^{11}$ m$^{-3}$ to approximately $10^{12}$ cm$^{-3}$. Alternatively, substrate 41 could be a semiconductor layer formed on an insulating layer, in a so-called silicon-on-insulator (SOI) wafer configuration. Two N+ type diffused regions 42 and 43, disposed in the substrate 41, act as the source and drain, respectively. The dopant concentration of the N+ diffused regions 42 and 43 are selected to have high conductivity for good ohmic contact with the substrate 41 and may be doped with an appropriate material, such as phosphorous or arsenic to a doping density from about $10^{14}$ cm$^{-2}$ to about $10^{16}$ cm$^{-2}$ although other N type doping materials and doping concentrations are not excluded. In the preferred embodiment, the N+ diffused regions 42 and 43 may extend up to a depth of approximately 0.6 µm in the substrate. Two N-type diffused regions 44 and 45, disposed in the substrate 41 on the source and drain side, act as the N-extension regions of the N+ source and drain regions 42 and 43, respectively. The doping profile of N-extension regions 44 and 45 is selected so that the N-extension region, on both the source and drain side, completely surrounds the portion of N+ source region 42 and N+ drain region 43 extending under the substrate surface. The doping concentration of each of the N-extension regions is optimized to obtain the desired beneficial results; preferably not so high as to induce junction breakdown between the N-extension region and the P-type substrate, and not so low as to cause punchthrough breakdown in the substrate, when voltages are applied on the N+ drain region 43 during device operation. In the preferred embodiment, the dopant density of the N-extension regions 44 and 45 is selected from about $10^{12}$ cm$^{-2}$ to about $10^{13}$ cm$^{-2}$, with an appropriate N-type material, such as phosphorous or arsenic, although other N type doping materials and doping concentrations are not excluded. The N-extension regions 44 and 45 may extend to a depth of from about 0.6 µm up to about 1.5 µm in the substrate, so that they completely surround the portion of the N+ source and drain region 42 and 43 extending into the substrate, as described above. A channel, having a length from about 1 µm to about 3 µm, extends, along the substrate surface, between the facing edges 44a of the N-extension region 44 and 45a of the N-extension region 45. A thin gate dielectric layer 46 of thermal silicon dioxide having a thickness from about 250 Å to about 400 Å is provided on the surface of the substrate, although other suitable gate dielectric material is not excluded. Gate dielectric layer 46 extends from a location between the edge region 42a of the N+ source region 42 and edge region 44a of N-extension region 44, along the substrate surface, to a location between the edge region 45a of the N-extension region 45 and the edge region 43a of the N+ source region 43. A WSi$_x$-Poly (Tungsten Silicide over Polysilicon) stacked gate layer 47 is provided over the gate dielectric layer 46 to a Poly thickness from about 1000 Å to about 2000 Å, and a WSi$_x$ thickness from about 800 Å to about 1800 Å, although other suitable conductive gate electrode materials and structures are not excluded. Two spacers 48 and 49 having a base dimension from about 300 Å to about 2000 Å, made of TEOS SiO$_2$ are provided on both edges of gate layers 46, 47 to cover the corners between the edge sidewall and the substrate, although other suitable spacer dielectric materials such as Si$_3$N$_4$ and other spacer dimensions may also be used. One lightly doped P-type plug 50 is formed from an area on the substrate surface under spacer 49. In the preferred embodiment, the plug region 50 may be doped with a suitable P-type material, such as boron, to a surface doping density from about $10^{13}$ cm$^{-2}$ to about $10^{14}$ cm$^{-2}$, although other P-type doping materials and doping concentrations are not excluded. The P-type diffused region 50 may extend from the substrate surface to a depth of approximately 0.5 µm in the substrate. Field oxide 55 is provided to isolate high voltage MOS transistor 40 from neighboring devices on the same substrate.

In the operation, the HVNMOS transistor structure 40 of this preferred embodiment provides weaker electric field near the edge of the N+ drain region 43, compared to the previously known prior art HVNMOS transistors with similar device dimensions under similar operating conditions.

Figure 2B:
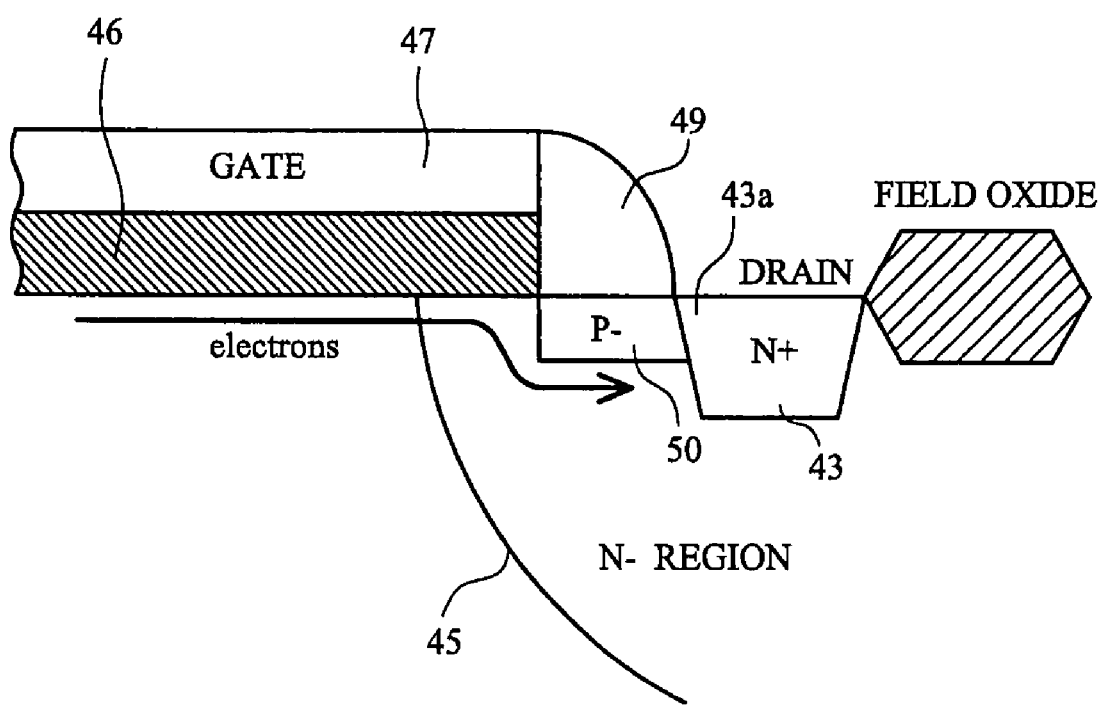
FIG. 2B is an enlarged cross-sectional view of a portion of the channel region and drain region with a P-type diffusion region in accordance with FIG. 2A.

FIG. 2B is an enlarged sectional view of a portion of the channel region and drain region with a P-type doped region 50 in accordance with FIG. 2A. As appreciated by those skilled in the art, when an N-type high voltage MOS transistor 40 of the preferred embodiment is turned on and operates in the saturation mode, a strong inversion layer is formed under the gate and a conductive channel along the substrate surface is created between the source and drain region. Electron current (shown as an arrow in FIG. 2B) flows from the source region into the drain region. By forming a P-type plug 50, as presented in the preferred embodiment, electrons in the channel must bypass this P-type "road block", because the P-type doped region 50 is non-conductive to electrons. Simply put, when in operation, an HVNMOS transistor with this preferred inventive structure creates a longer conductive path between the N+ source the N+ drain region. Because electric field is a function of both voltage and distance, this longer conductive path serves to decrease the peak electric field in the conducting channel near the N+ drain edge. This, in consequence, will prevent snapback breakdown from happening near the drain side. Also as should be recognized by those skilled in the art, by forming the P-type plug 50 as presented in the preferred embodiment, the impact ionization region is pushed far below the silicon surface, which, in turn, reduces the possibility of "hot carriers" reaching the gate oxide.

Two particularly advantageous features of the above described embodiment bear noting. First, the N-extension region 45 should surround the portion of the P-type region 50 that extends into the substrate, so that electrons in the channel region can flow into the N+ drain region 43 through a portion of the N-extension region 45. Second, the P-type doping concentration of the P-type plug region 50 should be carefully chosen so that a local junction breakdown between the N+ drain region 43 and the P-type plug region 50 will not happen during device operation. In preferred embodiments, the net doping density of the P-type plug region 50 is selected to be lower than that of the N+ drain region 43.

Figure 3A:
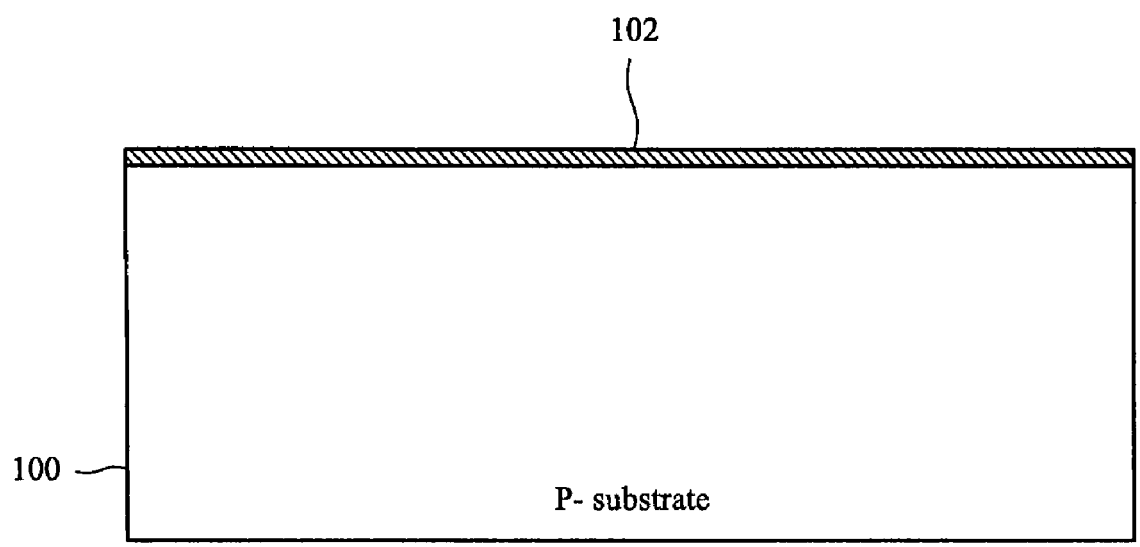
FIGS. 3A-3I are cross-sectional views of process steps for the fabrication of an embodiment of high voltage NMOS transistors.
Figure 3B:
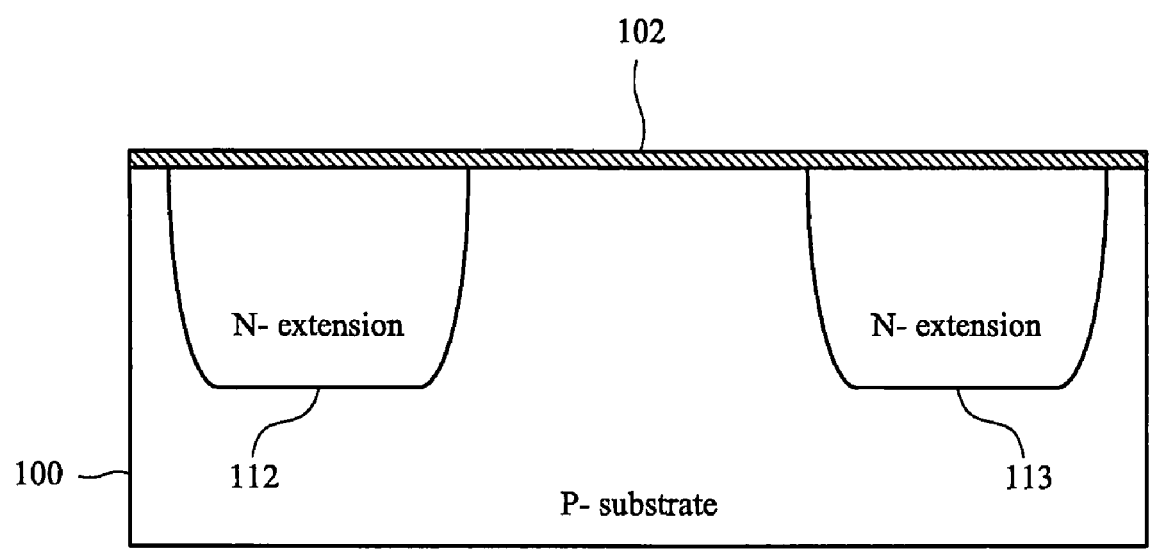

FIGS. 3A-3I are cross-section views of process steps for fabricating an embodiment of high voltage NMOS transistors. FIG. 3A shows an initial process step during which a layer of screen oxide 102 is grown atop a portion of a P-type silicon substrate 100. A first photolithography process is applied to the surface of the oxide layer 102 to form photoresist pattern (not shown) for selective implantation of N-type dopants. The N-type dopants are then driven into the P-substrate by a thermal process to form N-extension regions 112 and 113 as shown in FIG. 3B. N-extension region 112 forms an extension of the source of the NMOS transistor formed subsequently, while N-extension region 113 forms an extension of the drain of the NMOS transistor formed subsequently. In preferred embodiments, the N-extension region 112 and 113 are formed by phosphorus diffusion with a doping density from about $10^{12}$ cm$^{-2}$ to about $10^{13}$ cm$^{-2}$. The N-extension region 112 and 113 may extend from the substrate surface to a depth of up to 1.5 µm or more into the substrate.

Figure 3C:
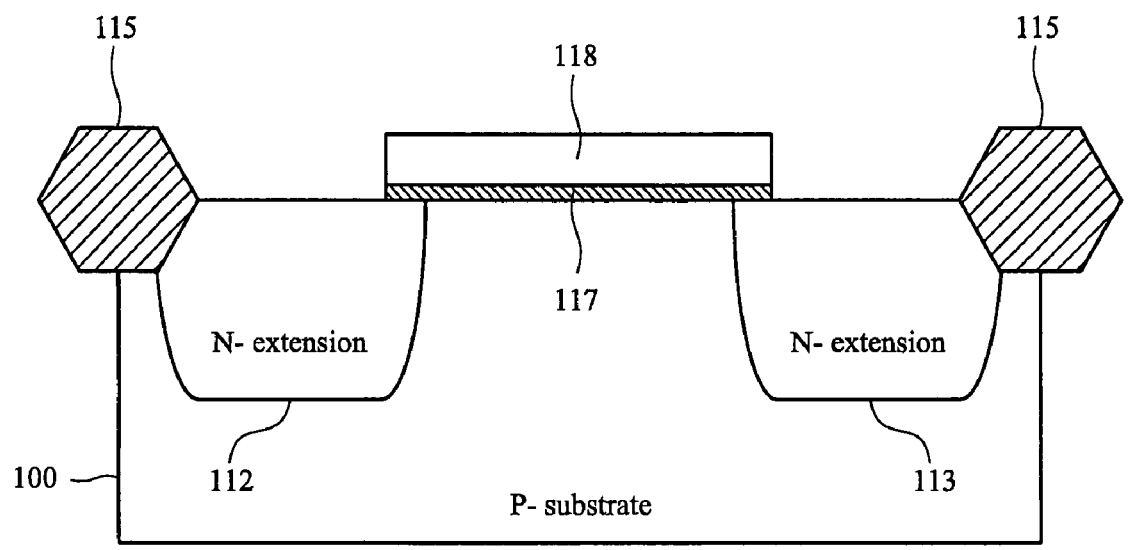

Shown in FIG. 3C, selective oxidation may be performed to form field oxide regions 115. Field oxide regions 115 surround the MOS transistor to isolate it from neighboring devices on the same substrate. Screen oxide layer 102 is removed from the substrate by an etch process, and a thermal oxide of thickness from about 250 Å to about 400 Å is grown on the substrate and patterned to form gate oxide layer 117. Gate electrode 118 can then be patterned and formed over gate oxide layer 117 as shown, which includes forming a first polysilicon layer (not shown) of thickness from about 1000 Å to about 2000 Å, and a WSi$_x$ layer (not shown) of thickness from about 800 Å to about 1800 Å, on top the polysilicon layer. Alternatively, gate electrode 118 can be formed prior to the formation of N-extension region 112 and 113 through similar processing steps, as can be well appreciated by those skilled in the art.

Figure 3D:
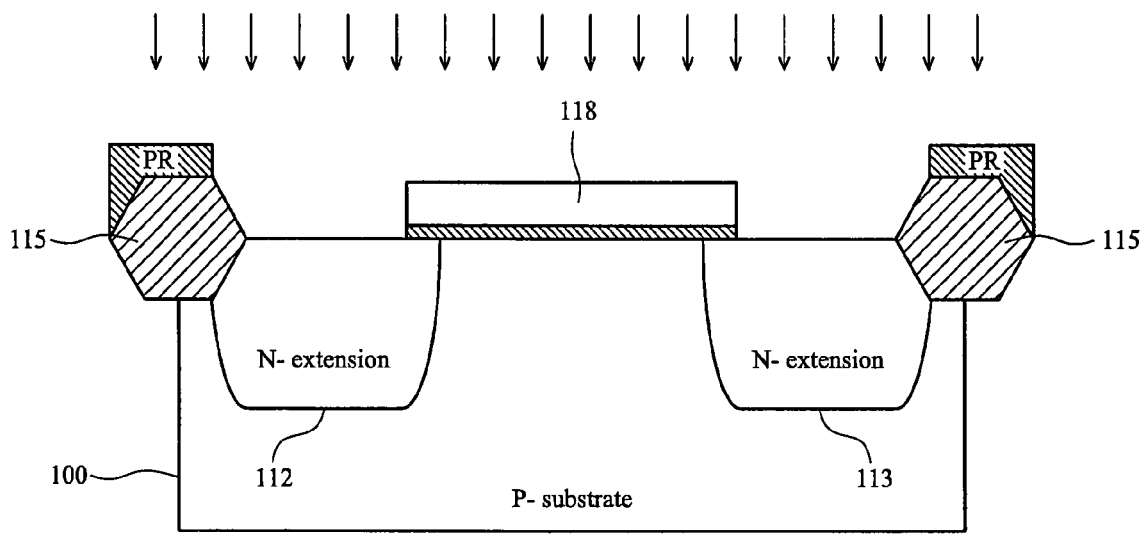
Figure 3E:
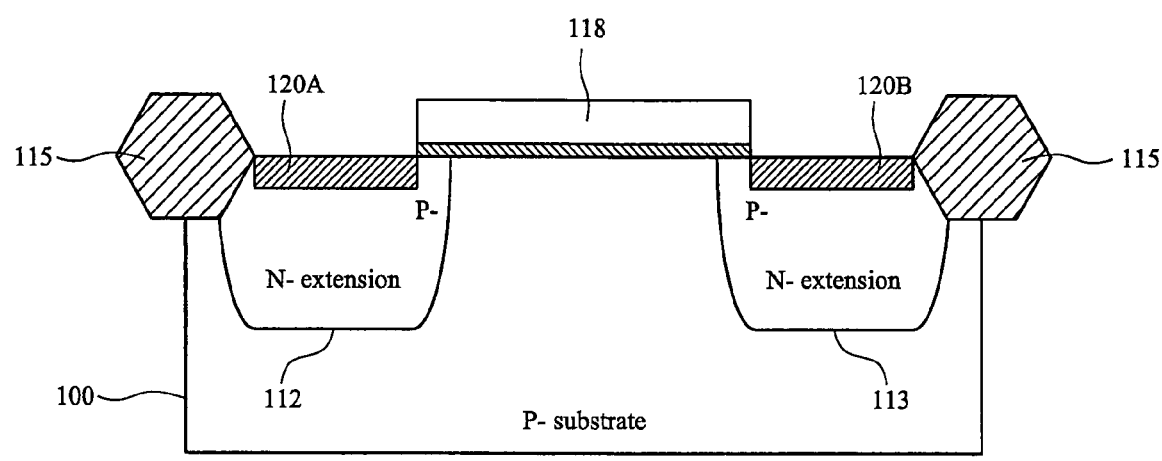

After the gate is created, a second photolithography process, shown in FIG. 3D, is applied to form photoresist pattern (labeled as "PR") for selective implantation of P-type dopants into the N-extension region 112 of the source and 113 of the drain. In preferred embodiments, the mask used to define the P-type implant region is the same mask used to pattern the N-type LDD (lightly doped drain) region in a conventional process flow of making a short channel NMOS device. This is a self-aligned process where the edges of the P-type region are defined by the patterning of gate 118 and field oxide 115. The P-type implant is preferably carried out using a medium-current ion implanter with boron to reach an impurity density from about $10^{13}$ cm$^{-2}$ to about $10^{14}$ cm$^{-2}$, although other P-type implant materials and implant densities are not excluded. Lightly doped P-type regions 120A and 120B will be formed after this process step as shown in FIG. 3E. The P-type regions 120A and 120B may extend from the substrate surface to a depth of approximately 0.5 µm into the substrate.

Figure 3F:
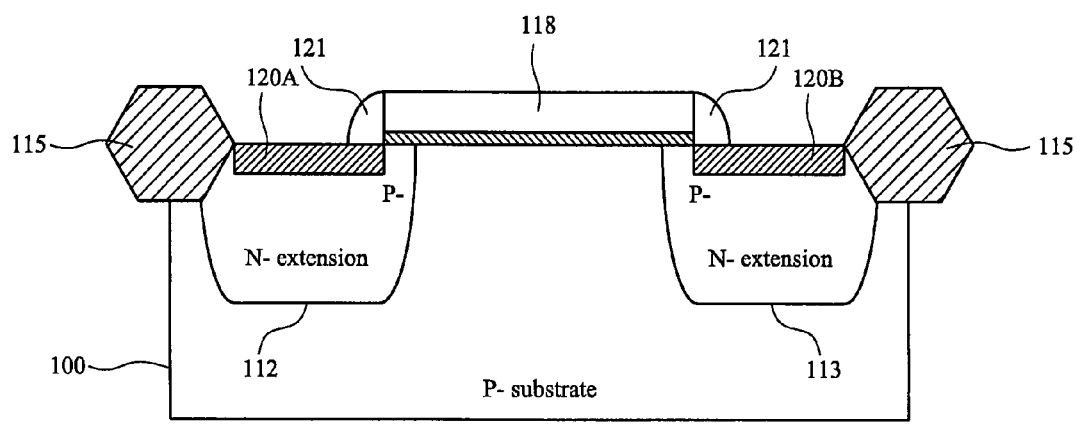

Following the formation of the lightly doped P-type regions 120A and 120B, a TEOS oxide film of thickness from about 500 Å to about 3000 Å is deposited on the substrate and patterned gate 118. A dry-etch process is then applied to the substrate, which removes the oxide from the flat areas while leaving spacers 121 at the sidewalls of the gate, as shown in FIG. 3F. In preferred embodiments, spacer base width of from about 300 Å to about 2500 Å is obtained. Other spacer dielectric materials, such as Si$_3$N$_4$ can also be used, as can combinations of materials.

Figure 3G:
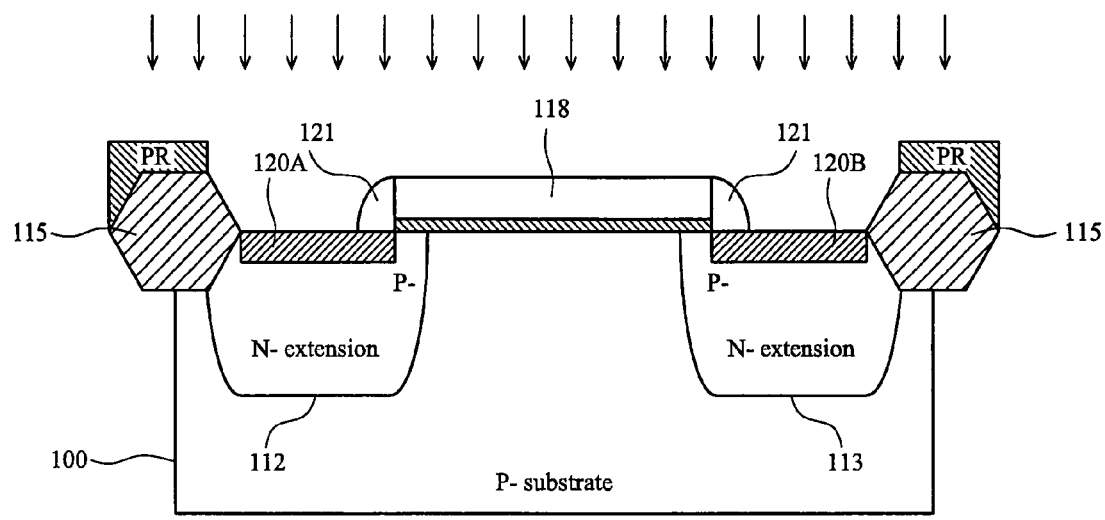
Figure 3H:
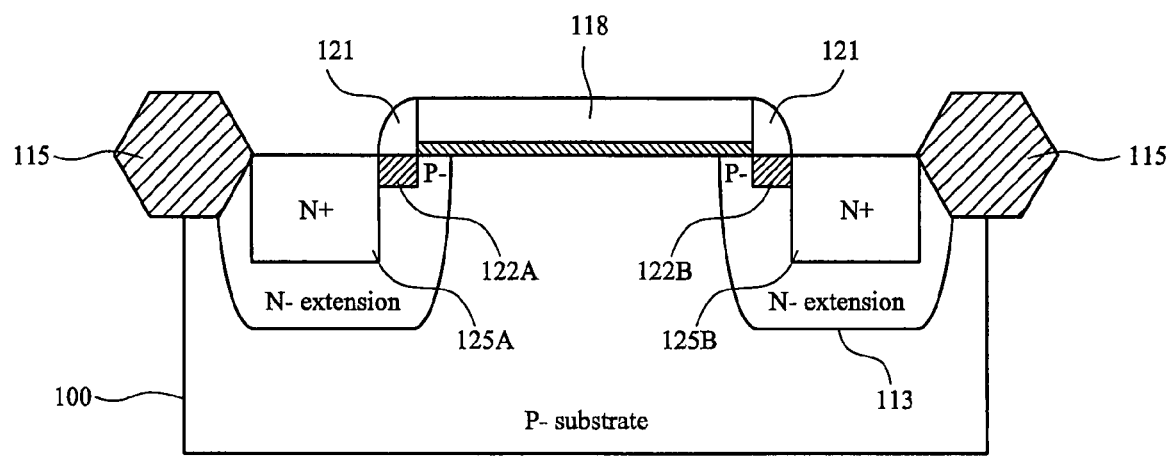

After spacer formation, a heavy and deep N-type ion implantation is conducted to form the low resistance contacts to the drain/source extension regions, as shown in FIG. 3G. Preferably, the mask used to define the N-type implant region is the same mask used to pattern the N-type LDD (lightly doped drain) region in a conventional process flow of making a short channel NMOS device, where only the NMOS active areas are screened. The resulting heavily doped N+ region is self-aligned to the spacer edges and the field oxide. The N+ implant is preferably carried out using a high-current ion implanter with phosphorus to reach an impurity density from about $10^{14}$ cm$^{-2}$ to about $10^{16}$ cm$^{-2}$, although other N-type implant materials and implant densities are not excluded. A heavily doped N+ source region 125A and a heavily doped N+ source region 125B will be formed after this process step as shown in FIG. 3H. The N+ regions 125A and 125B may extend from the substrate surface up to a depth of approximately 0.6 µm or more in the substrate. Note that those regions of P-type regions 120A and 120B underlying spacers 121 are effectively masked by the spacers during this implant step. The unmasked portions of P-type regions 120A and 120B are counter-doped by the heavy N-type implant and become N-type regions, while the masked portions remain P-type, thus forming P-type plugs 122A and 122B, respectively.

Figure 3I:
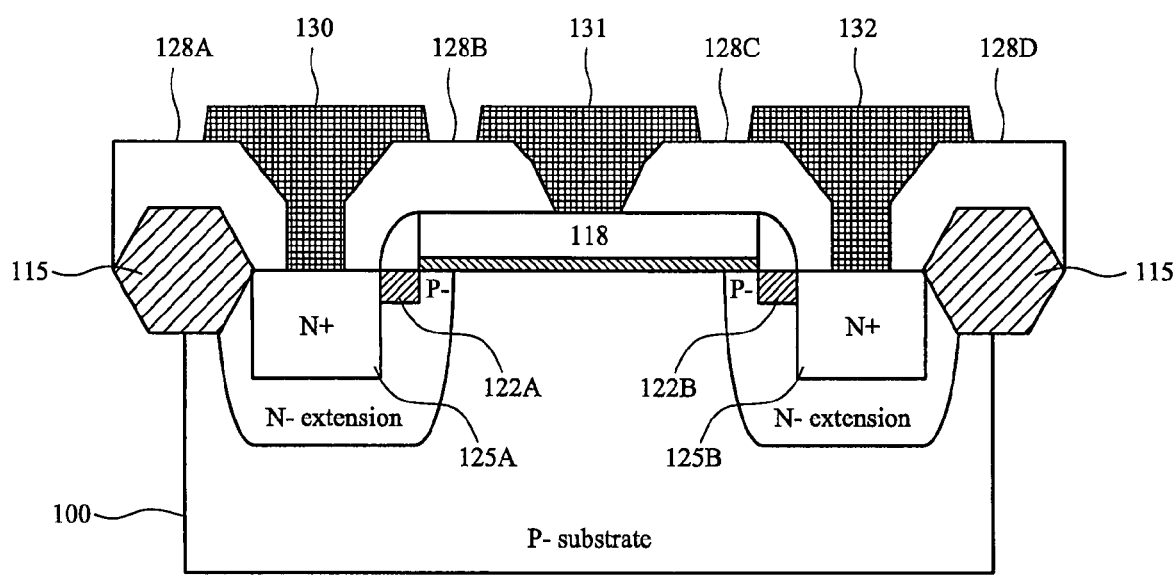

The process of making the HVNMOS transistor of the preferred embodiments of the current invention is completed by forming metal contacts to the gate, drain, and source of the transistor. In forming metal contacts, a CVD SiO$_2$ dielectric layer is grown on the substrate. A photolithography process is applied to form the pattern for the metal contacts to the gate, drain, and the source of the transistor. A selective etch process then follows to create openings to the gate, source, and drain, which leaves SiO$_2$ dielectric layer 128A, 128B, 128C, and 128D as shown in FIG. 3I. Metal deposition and patterning may be performed to form metal contacts 130, 131 and 132, which connect to the N+ source region 125A, gate layer 118 and N+ drain region 125B of the HVNMOS transistor, respectively.

It should be recognized by those skilled in the art that the process steps of forming the current embodiment results in two, symmetric lightly doped P-type plug regions 122A and 122B formed on the source and drain side. Compared to the embodiment shown in FIG. 2A, where the lightly doped P-type region 50 is formed only on the drain side, this embodiment offers two advantages with little impact on device performance. First, the formation of the lightly doped P-type plug region 122 A and 122B is carried out using the same mask used for forming the N-type LDD (lightly doped drain) region in a conventional process flow of making a short channel NMOS device. No additional mask is needed, which offers tremendous cost advantage on developing novel semiconductor devices. Second, circuit designers using this embodiment will have the flexibility of choosing either side of the symmetric structure of lightly doped P-type regions as the drain, while leaving the other side as the source, in the knowledge that the lightly doped P-type plug region on the source side will have no effect on improving on-breakdown voltage or other negative impacts on device performance.

Figure 4:
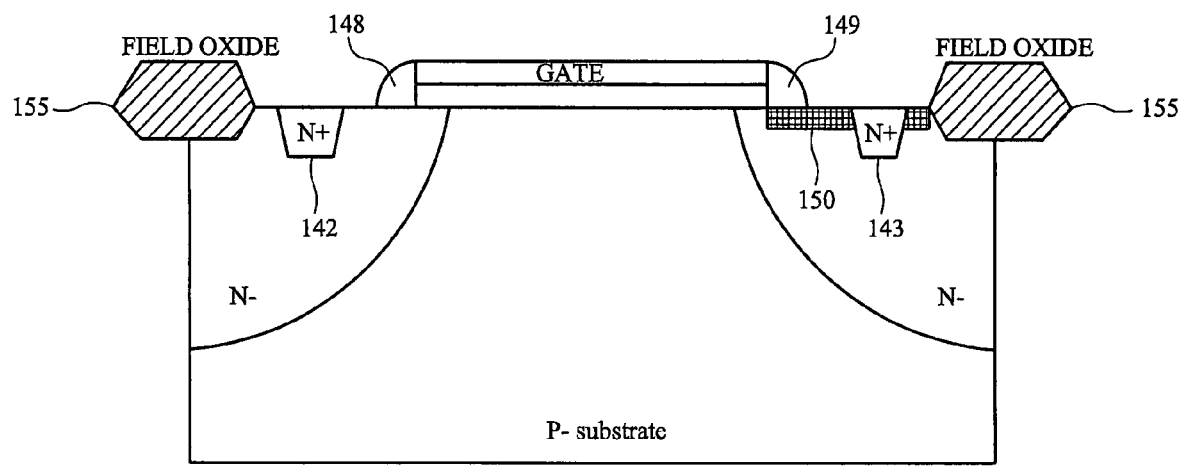
FIG. 4 is a cross-sectional view of another illustrative embodiment of a high voltage NMOS transistor with a P-type implant in an N-type drain extension region.

FIG. 4 illustrates another embodiment of high voltage NMOS transistor. Compared to the lightly doped P-type plug region 50 formed under spacer 49, as shown in FIG. 2A, the lightly doped P-type region 150 of this embodiment is provided to extend laterally beyond the edge of spacer 149, to a heavily doped N+ drain region 143, which adjoins a first portion of region 150 and a second portion of region 150, extending to the field oxide 155, as shown in FIG. 4. On the source side, a heavily doped N+ source region 142 is formed between the edges of spacer 148 and field oxide 155, wherein the edges of region 142 are displaced from the edges of spacer 148 and field oxide 155. As recognized by those skilled in the art, a transistor structure of this embodiment provides an even longer path for the voltage to drop between the N+ source and N+ drain of the transistor, without increasing device dimensions, which in turn, allows the transistor to present an even higher on-breakdown voltage, when compared with prior art high voltage transistors.

Figure 5A:
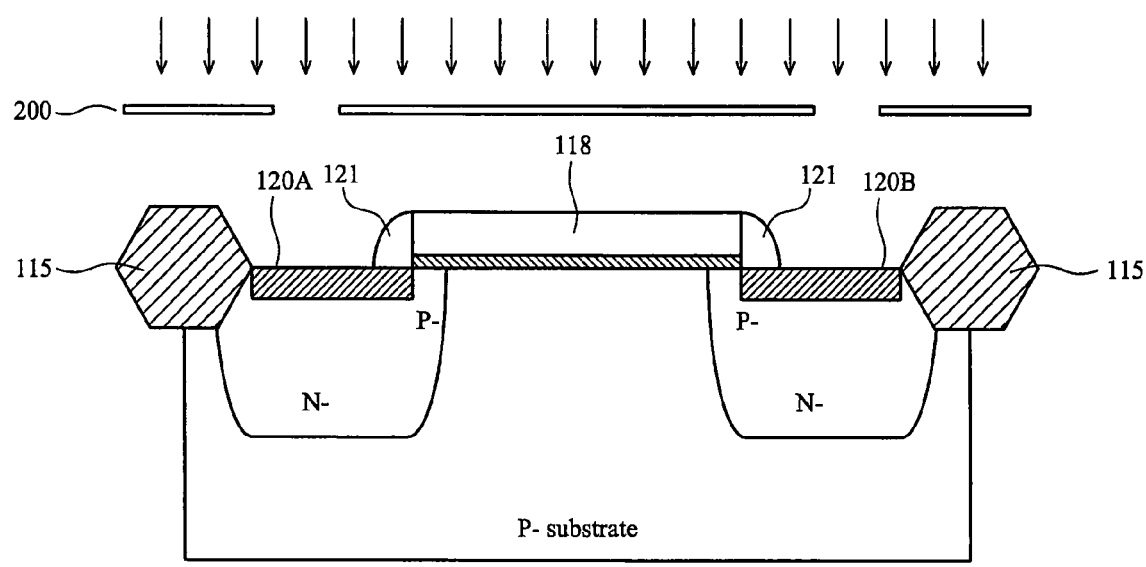
FIGS. 5A and 5B are cross-sectional views of process steps of making the N+ source/drain contact regions in accordance with another embodiment shown in FIG. 4.
Figure 5B:
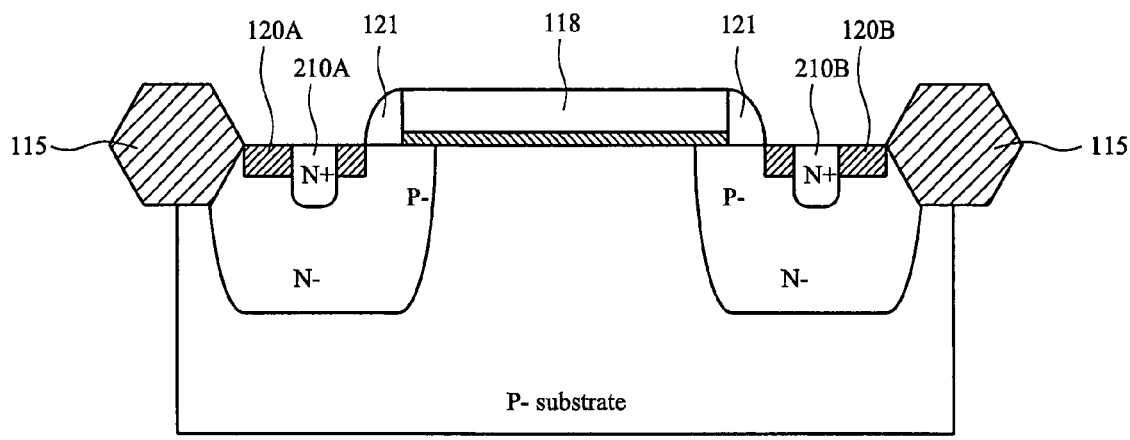

FIGS. 5A-5B illustrates process steps for fabricating another embodiment of a high voltage NMOS transistor with a longer drain-to-source path. The steps shown and described earlier with respect to FIGS. 3A-3F are the same initial steps used in this embodiment.

After the formation of lightly doped P-type region 120A, 120B and spacer 121 as shown in FIG. 3F, a new mask layer 200 is employed to define the area where a heavy and deep N-type ion implantation is to be conducted to form the low resistance contacts to the drain/source extension, as shown in FIG. 5A. The N+ implant is carried out using a high-current ion implanter with phosphorus to reach an impurity density preferably from about $10^{14}$ cm$^{-2}$ to about $10^{16}$ cm$^{-2}$, although other P-type implant materials and implant densities are not excluded. A heavily doped N+ source region 210A and a heavily doped N+ drain region 210B will be formed after this process as shown in FIG. 5B. The N+ regions 210A and 210B may extend from the substrate surface preferably up to a depth of approximately 0.6 μm into the substrate. The process of forming metal contacts to the gate, drain, and source of the transistor of the current embodiment is the same as those shown and described above with respect to in FIG. 3I.

Figure 6A:
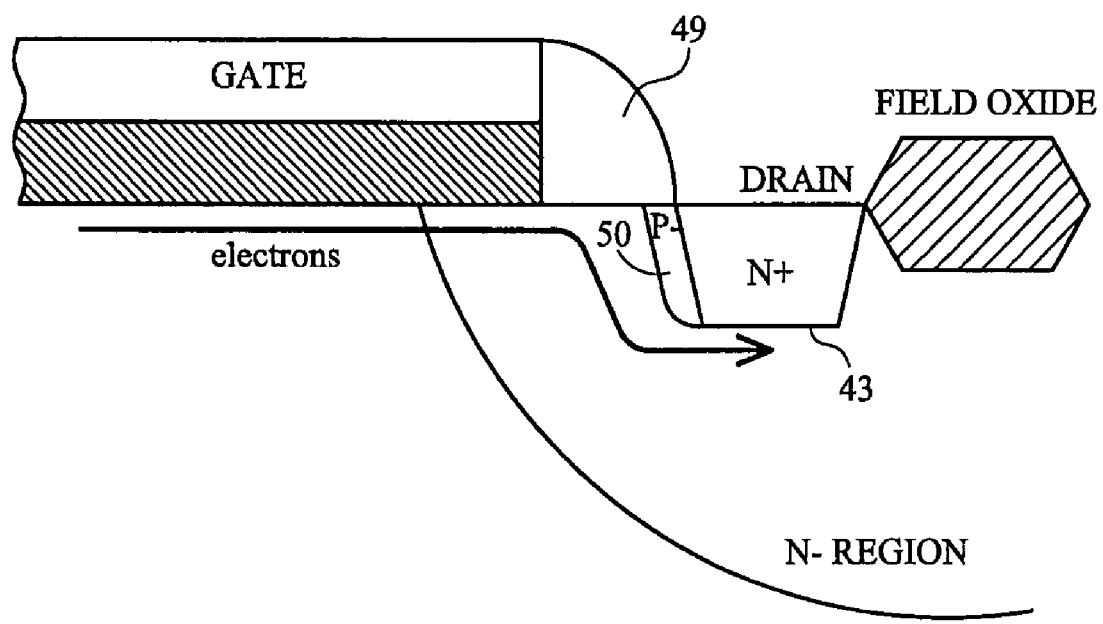
FIGS. 6A and 6B are cross-sectional views of yet another illustrative embodiment of a high voltage NMOS transistor with a P-type implant in an N-type drain extension region, and one of the process steps of making the same.
Figure 6B:
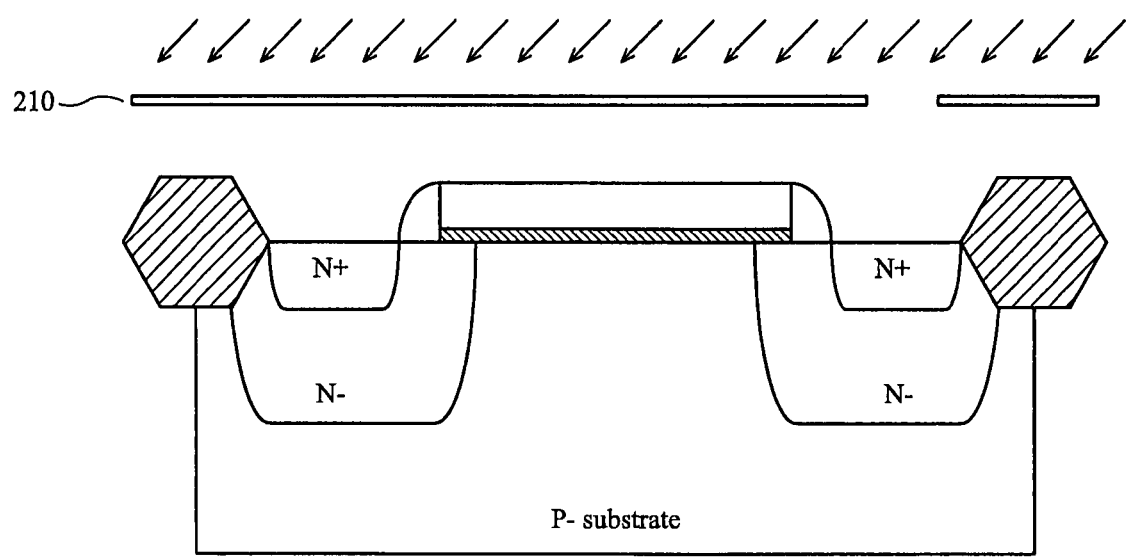

FIG. 6A illustrates an enlarged sectional view of a portion of the channel region and P-type diffused region of yet another embodiment of the current invention. It differs from the previously described embodiments in that the lightly doped P-type region 50 is no longer a "plug" extending into the substrate under the spacer, such as is shown in FIG. 2B. Rather, P-type region 50 covers the left portion of the side wall of the heavily doped N+ drain region 43, as shown in FIG. 6A. It is apparent that this structure creates a longer path for voltage drop between the N+ source and the N+ drain region (electron current shown as an arrow in FIG. 6A), and pushes the impact ionization region further below the substrate surface to reduce "hot carrier" effects. The lightly doped P-type region 50 of this structure can be formed, after spacer formation, by an angle implantation of boron, as shown in FIG. 6B, to a local dopant density from about $10^{13}$ cm$^{-3}$ to about $10^{14}$ cm$^{-3}$, although other P-type materials and methods of forming region 50 are not excluded. The implantation may be carried out by an additional mask 210, before or after N+ source and drain formation.

As will be recognized by those skilled in the art, the inventive principle of improving on-breakdown voltage by increasing the current path between N+ source and drain region illustrated in the above embodiments is also applicable to low voltage MOS transistors, wherein the "hot carrier" degradation remains to be a serious technical obstacle for devices of deep sub-micron feature sizes. This negative effect escalates as transistor channel lengths continue to shrink.

Figure 7:
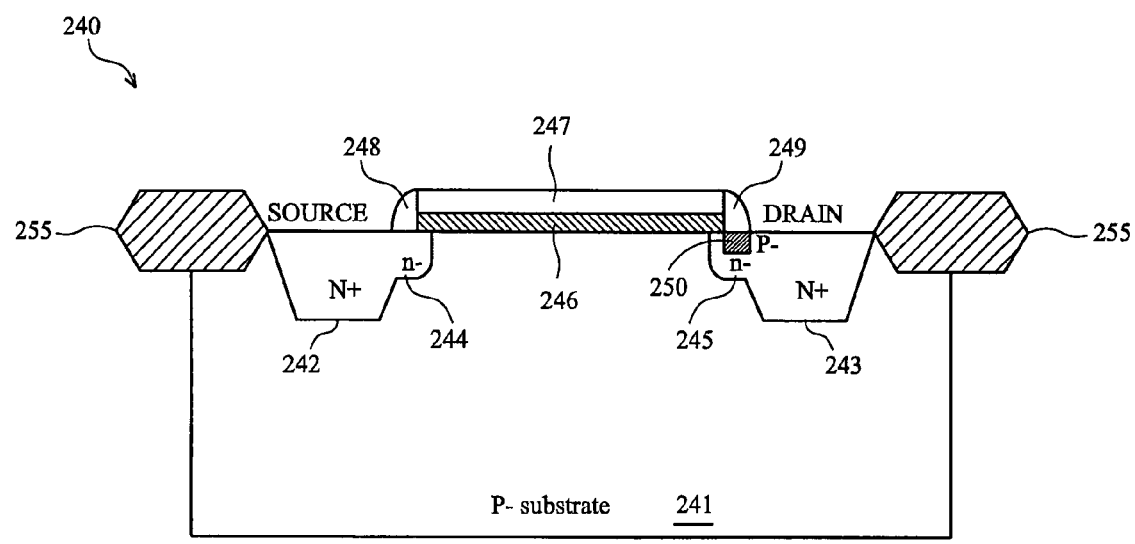
FIG. 7 is a cross-sectional view of an illustrative embodiment of a low voltage short channel NMOS transistor with a P-type implant in LDD region.

FIG. 7 shows a cross-section view of a low voltage NMOS transistor structure in accordance with a further embodiment of the current invention. Referring to FIG. 7, an N-channel enhanced mode MOS transistor 240 comprises a bulk substrate 241 of P-type monocrystalline silicon having a low dopant concentration of approximately $10^{14}$ cm$^{-3}$. Two N+ type diffused regions 242 and 243, disposed in the substrate 241, act as the source and drain, respectively. The dopant concentration of the N+ diffused region 242 and 243 are selected to have high conductivity for good ohmic contact with the substrate 241 and may be doped with an appropriate material, such as phosphorous or arsenic to a doping density from about $10^{14}$ cm$^{-2}$ to about $10^{16}$ cm$^{-2}$, although other N type doping materials and doping concentrations are not excluded. Two lightly doped source/drain regions (LDD) 244 and 245, with shallower diffusion depth, are provided to adjoin the N+ source/drain region 242, 243, respectively. A channel region, having a length from about 0.1 μm to about 1.0 μm extends along the substrate surface, between the facing edges of the LDD regions 244 and 245. A thin gate dielectric layer 246 of thermal silicon dioxide having a thickness from about 30 Å to about 200 Å is provided on the surface of the substrate, although other suitable gate dielectric material is not excluded. Gate dielectric layer 246 overlaps slightly the edges of the LDD regions 244 and 245, as shown in FIG. 7B. A gate layer 247 of suitable conductive gate electrode materials and stack structures is provided over the gate dielectric layer 246. Two spacers 248 and 249 having a base dimension from about 500 Å to about 3000 Å, made of TEOS $SiO_2$ are provided on both edges of gate layers 246, 247 to cover the corners between the gate sidewall and the substrate, although other suitable spacer dielectric materials such as $Si_3N_4$ and other spacer dimensions can also be used. One lightly doped P-type plug 250 is formed from an area on the substrate surface under spacer 249. In preferred embodiment, region 250 may be doped with a suitable P-type material, such as boron, to a surface doping density from about $10^{13}$ cm$^{-2}$ to about $10^{14}$ cm$^{-2}$, although other P-type doping materials and doping concentrations are not excluded. The P-type doped region 250 may extend from the substrate surface to a depth of approximately 0.5 μm in the substrate. Field oxide 255 is provided to isolate low voltage MOS transistor 240 from neighboring devices on the same substrate. In other embodiments, shallow trench isolation might be employed for isolation.

Figure 8A:
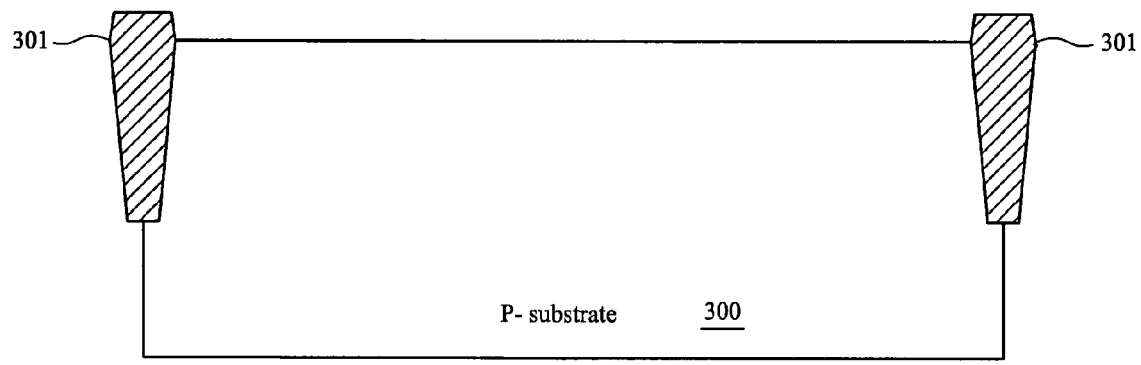
FIGS. 8A-8F are cross-sectional views of process steps for the fabrication of an embodiment of a low voltage short channel NMOS transistor.

FIGS. 8A-8F are cross-section views of process steps for fabricating of a preferred low voltage MOS device embodiment. FIG. 8A shows initial process steps during which a layer of silicon nitride (not shown) or other dielectric material is grown or deposited atop a portion of a P-type silicon substrate 300. A first photolithography process is applied to the surface of the silicon nitride to define the active region, where individual transistor is to be created. A dry etch process is applied to cut through the exposed silicon nitride and into the silicon substrate to form trenches. A $SiO_2$ layer is deposited to fill the trenches. A Chemical Mechanical Polishing (CMP) process is applied to remove the $SiO_2$ left on the flat surface. Trench oxide 301 is formed, followed by another etch process removing the silicon nitride covering the active region, resulting in the structure as shown in FIG. 8A.

Figure 8B:
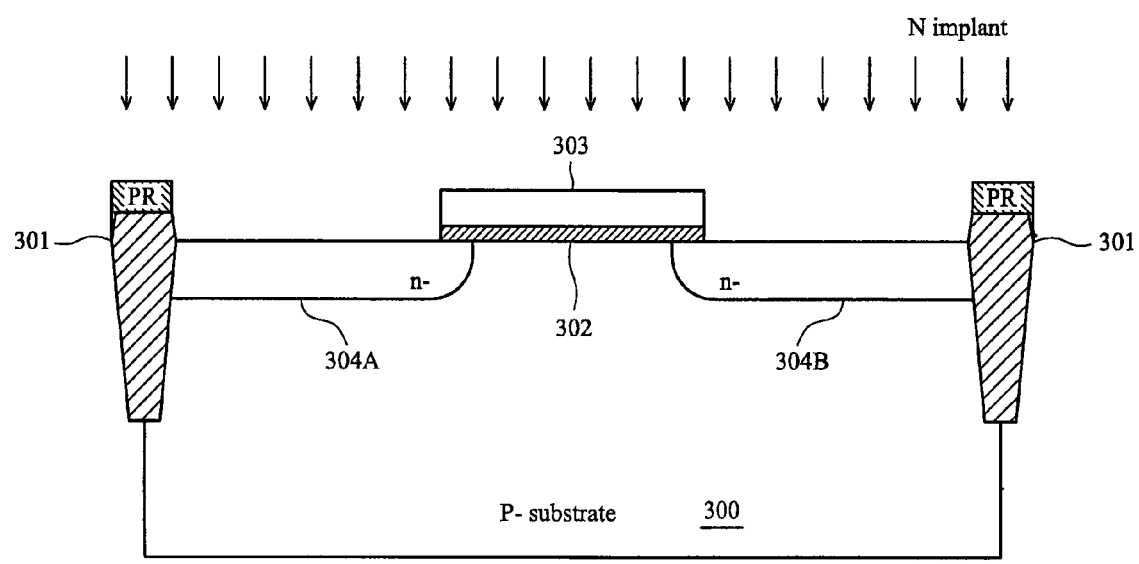

As shown in FIG. 8B, a thermal oxide of thickness from about 30 Å to about 200 Å is grown on the substrate and patterned to form gate oxide layer 302. Gate layer 303 with suitable conductive gate materials can then be formed atop gate oxide layer 302. A lightly doped N-type implant follows to form the source and drain LDD regions. This is a self-aligned process where the implantation mask screens the active region of NMOS transistors and edges of the lightly doped N-type region are defined by the patterning of the gate and trench oxide. The N-type implant is carried out using a medium-current ion implanter with phosphorus to reach an impurity density from about $10^{12}$ cm$^{-3}$ to about 10 cm$^{-3}$, although other N-type implant materials and implant densities are not excluded. A thermal cycle may be applied to drive the source/drain N− region edges slightly beneath the gate edges. A lightly doped N-type region 304A and 304B will be formed after this process step as shown in FIG. 8B. The N-type region 304A and 304B may extend from the substrate surface to a depth of approximately 0.5 μm or more into the substrate.

Figure 8C:
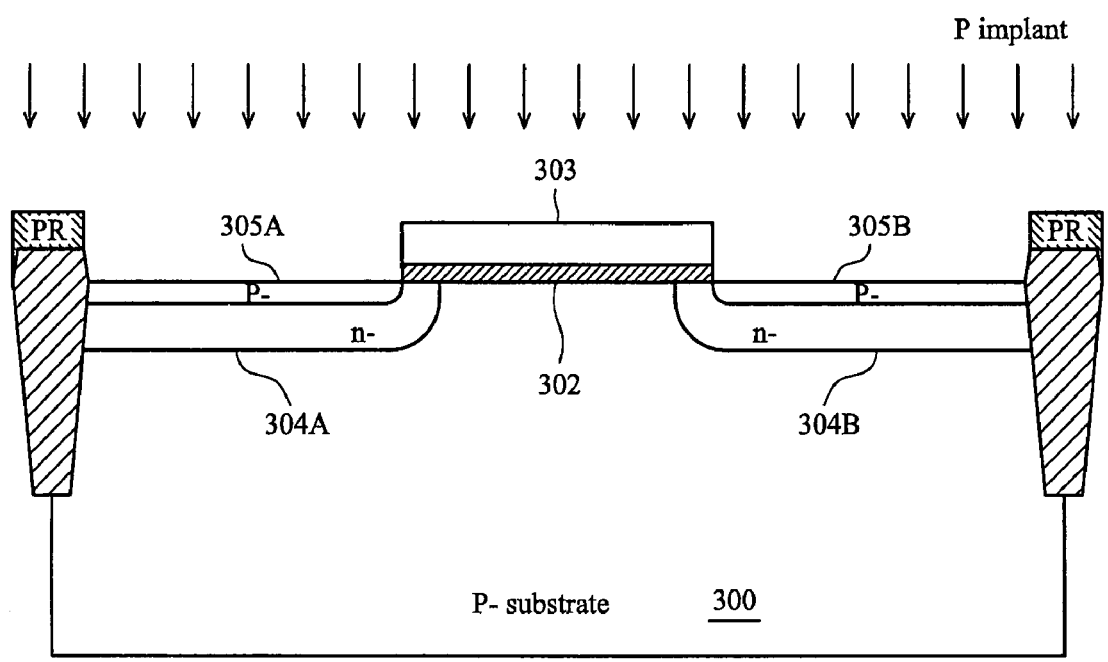

Following the formation of the N-type lightly doped regions 304A and 304B, a P-type implantation is conducted to form lightly doped P-type regions in the NLDD regions 304A and 304B. The mask used to define the P-type implant regions is the same mask used to pattern the NLDD (lightly doped drain) regions. The P-type implant is carried out using a high-current ion implanter with boron of an impurity density from about $10^{13}$ cm$^{-3}$ to about $10^{14}$ cm$^{-3}$. The implantation dose and depth should be carefully chosen so that the net P-type impurity density after factoring in the existing N-type impurity lies between about $10^{13}$ cm$^{-3}$ and about $10^{14}$ cm$^{-3}$, and the portions of the P-type regions 305A, 305B extending into the substrate are completely surrounded by the lightly doped N-type regions 304A and 304B, as shown in FIG. 8C.

Figure 8D:
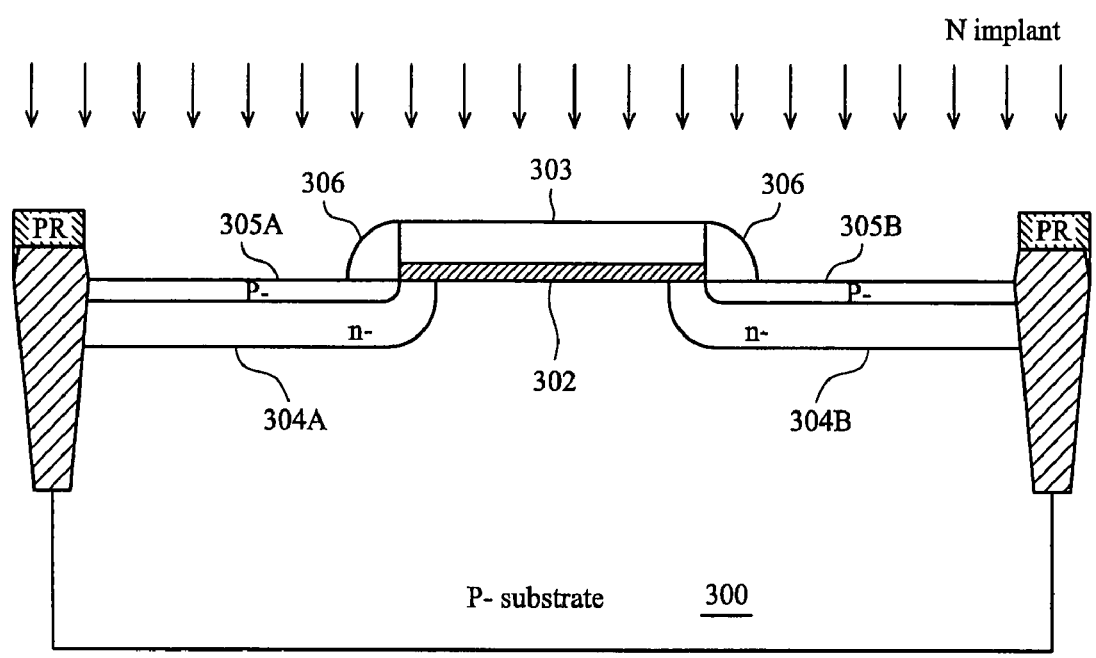

A TEOS oxide film of thickness from about 500 Å to about 3000 Å is deposited on the substrate. A dry-etch process is then applied to the substrate, which clear the oxide in the flat area while leaving spacers 306 at the sidewalls of the gate layers, as shown in FIG. 8D. In preferred embodiments, a spacer base width of from about 300 Å to about 2500 Å is obtained. Other spacer dielectric materials, such as $Si_3N_4$ can also be used.

Figure 8E:
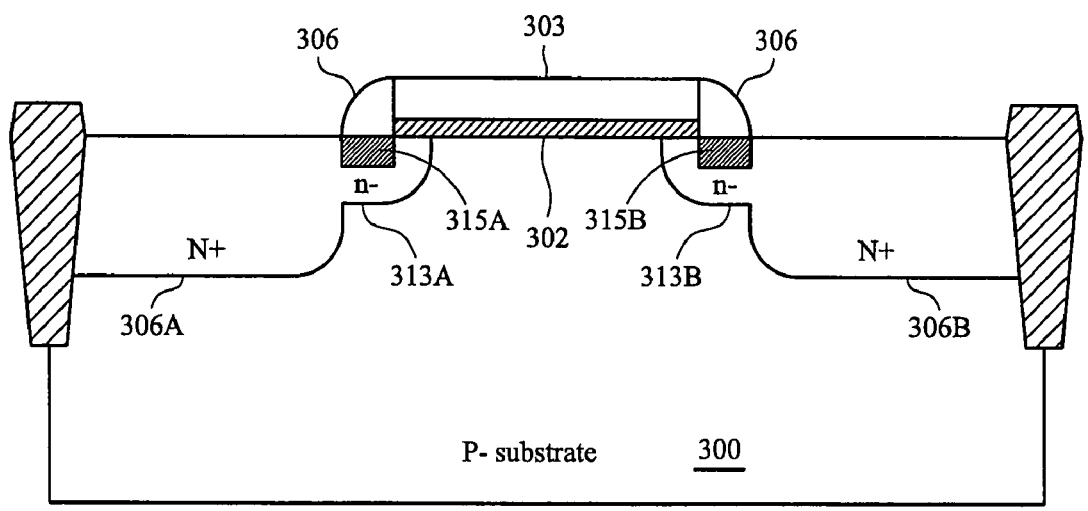

After spacer formation, a heavy and deep N-type ion implantation (shown in FIG. 8D) is conducted to form the low resistance contacts to the drain/source extension. In a preferred embodiment, the mask used to define the N+ implant region is the same mask used to pattern the NLDD regions 304A and 304B and P-type regions 305A, 305B, where only the NMOS active area is screened. The heavily doped N+ region is self-aligned to the spacer edges and the field oxide. The N+ implant is carried out using an high-current ion implanter with phosphorus to reach an impurity density from about $10^{14}$ cm$^{-3}$ to about $10^{16}$ cm$^{-3}$, although other N-type implant materials and implant densities are not excluded. A heavily doped N+ source region 306A and a heavily doped N+ source region 306B will be formed after this process as shown in FIG. 8E. The N+ region 306A and 306B may extend from the substrate surface up to a depth of approximately 0.6 μm or more in the substrate.

Figure 8F:
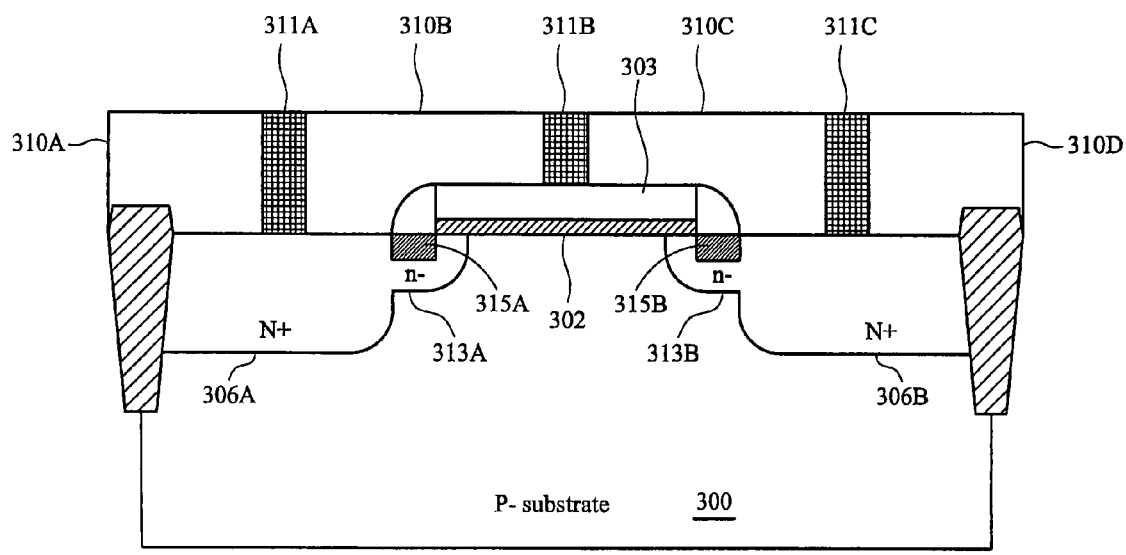

The process of making the short channel NMOS transistor of the current embodiment is completed by forming metal contacts to the gate, drain, and source of the transistor. In forming metal contacts, a CVD $SiO_2$ dielectric layer is grown on the substrate. A photolithography process is applied to form the pattern for the metal contacts to the gate, drain, and the source of the transistor. A selective etch process then follows to create openings to the gate, source, and drain, which leaves $SiO_2$ dielectric layer 310A, 310B, 310C, and 310D as shown in FIG. 8F. Tungsten deposition and patterning may be performed to form Tungsten plug 311A, 311B and 311C, which connect to the N+ source region 306A, gate layer 303 and N+ drain region 306B of the LVNMOS transistor, respectively, although other conductive materials and methods of forming metal contacts to the gate, drain, and source of the transistor are not excluded.

As will be appreciated by those skilled in the art, the process steps of forming the current embodiment results in two, symmetric lightly doped P-type regions 315A and 315B formed on the source and drain side, as shown in FIG. 8E. Compared to the structure shown in FIG. 7, where the lightly doped P-type region 250 is formed only on the drain side, this process flow offers two advantages with little impact on device performance. First, the formation of the NLDD regions 313A and 313B, lightly doped P-type region 315A and 315B, N+ contact regions 306A and 306B is carried out using a same mask layer. No additional mask is needed, which offers tremendous cost advantage in developing novel device structures. Second, circuit designers using symmetric structure made by this process flow will have the flexibility of choosing either side of the symmetric structure of lightly doped P-type regions as the drain, and leaving the other side as the source, in the knowledge that the lightly doped P plug region on the source side will have no effect on improving on-breakdown voltage or other negative impacts on device performance.

Figure 9:
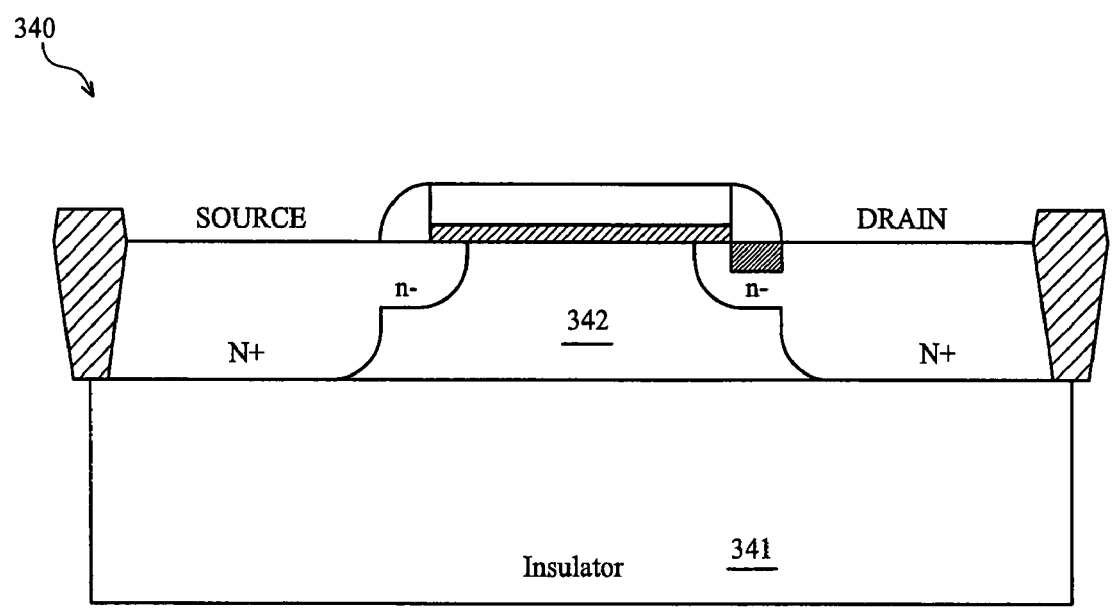
FIG. 9 is a cross-sectional view of an illustrative embodiment of an NMOS transistor of current invention formed on a silicon-on-insulator (SOI) wafer configuration.

FIG. 9 shows a cross-section view of a low voltage NMOS transistor structure in accordance with an even further embodiment of the current invention. Compared to the embodiment shown and described with respect to FIG. 7, an NMOS transistor 340 is formed in a semiconductor layer 342 atop an insulating material layer 341, in a so-called silicon-on-insulator (SOI) wafer configuration. As appreciated by those skilled in the art, this structure is fully optimized to eliminate the junction capacitance between the heavily doped source/drain regions and the insulating layer 341, which leads to higher transistor switching speed. This structure can also prevent punch-through breakdown and lower subthreshold current.

The starting material in making the current embodiment is a silicon-on-insulator (SOI) wafer, wherein a layer of insulator, preferably SiO2 or sapphire, is grown on top a silicon substrate. A thin layer of doped silicon is then grown atop the insulating layer and selectively implanted to form source and drain regions. The process of forming the gate, source, drain, plug regions of the current embodiment is similar to those shown and described above with respect to FIG. 8A-8F.

While NMOS transistors are used in above preferred embodiments to illustrate the inventive principle. It should be recognized by those skilled in the art that a high voltage P-channel enhance mode MOS transistor, with a lightly doped N-type plug formed in the P-extension region of drain may also be made in accordance with the principles of the invention by providing substrate, source, and drain region of the opposite doping type. The inventive principle applies to high voltage N-channel and P-channel depletion mode MOS transistors, low voltage P-channel enhance mode MOS transistors, low voltage N-channel and P-channel depletion mode MOS transistors, as well.

Figure 1A:
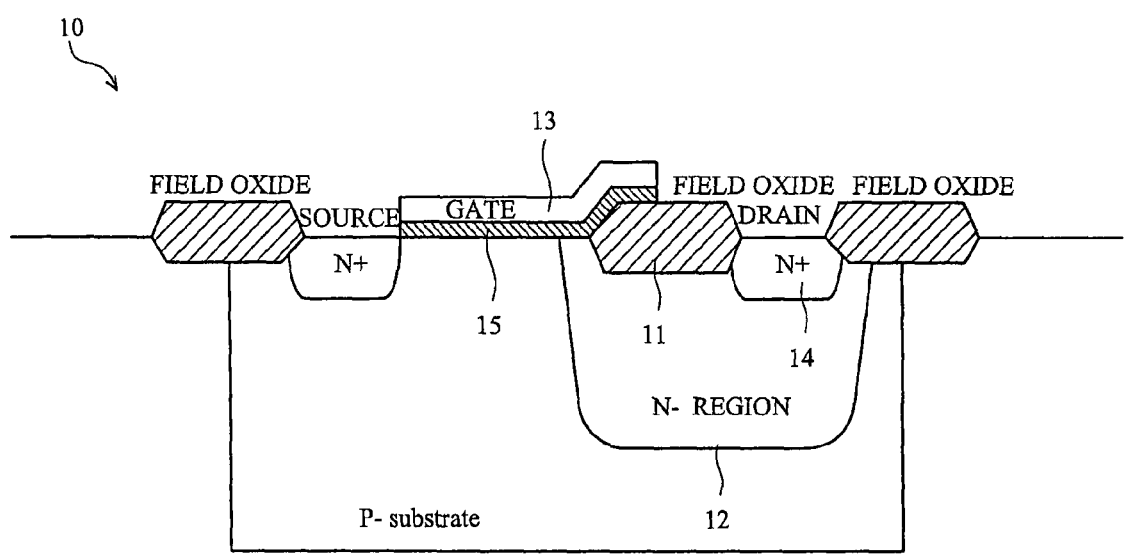
FIGS. 1A and 1B are cross-sectional views of prior art high voltage MOS transistors.
Figure 1B:
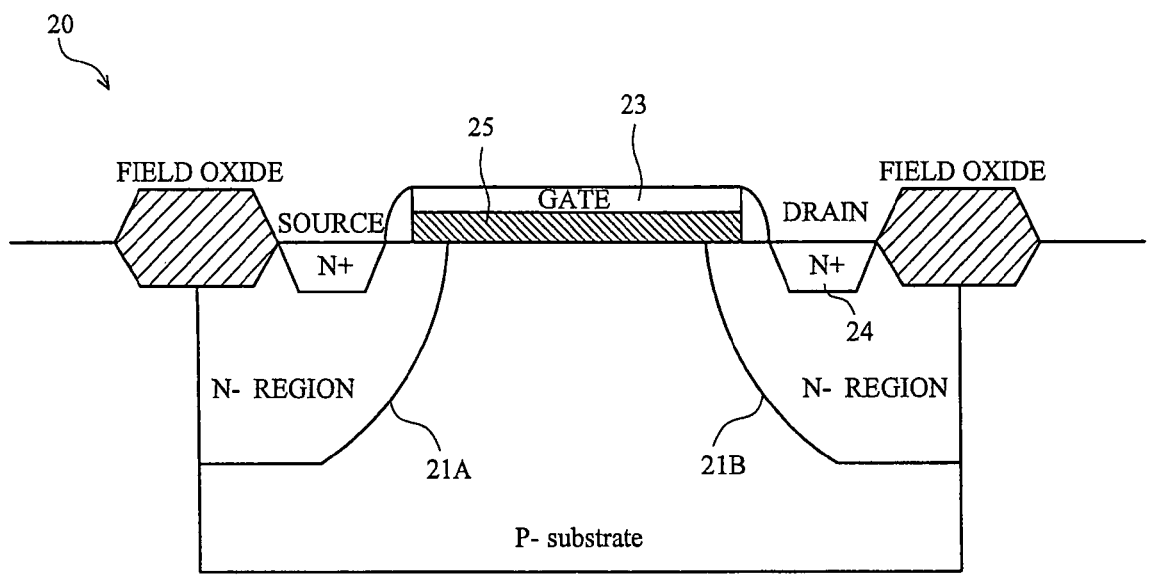
Figure 1C:
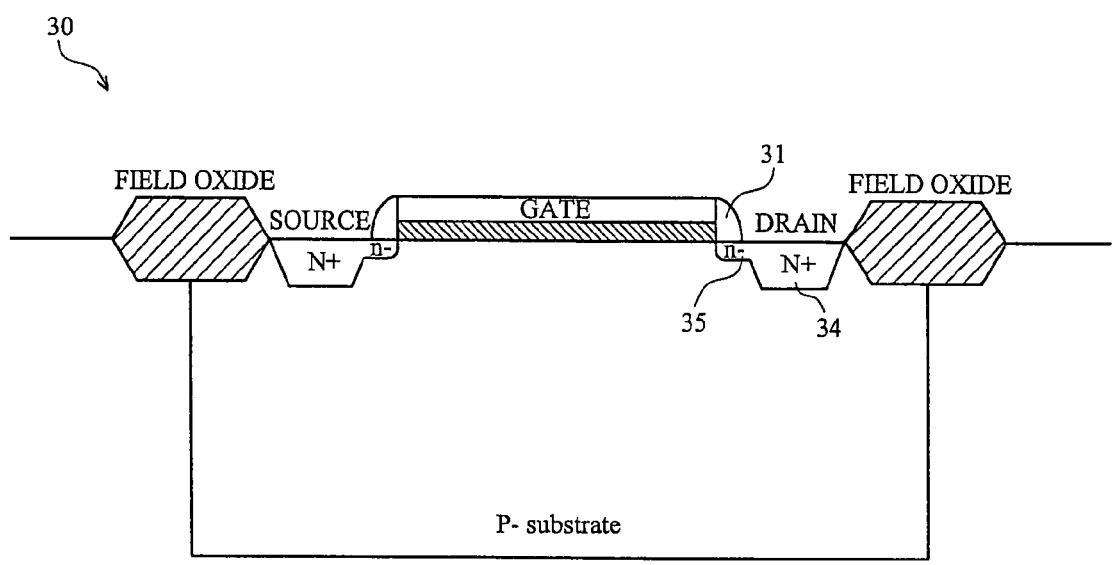
FIG. 1C is a cross-sectional view of a prior art low voltage short channel NMOS transistor.

Silicon prototype of an HVNMOS transistor of a preferred embodiment of the current invention was fabricated, where a P-type plug region is formed in the N-extension drain region, as shown in FIG. 2A. This embodiment was compared to a prior art HVNMOS device of FIG. 1B with similar device dimensions. The results are shown in the table below:

|  | Prior Art HVNMOS Transistor of FIG. 1B | HVNMOS Transistor with P-type plug of the Current Invention | Units | Vg |
| --- | --- | --- | --- | --- |
| Snapback | 13.2 | 16.1 | Volts | 4 |
| Breakdown | 13.4 | 16.3 | Volts | 6 |
| Voltage | 14.4 | 16.6 | Volts | 8 |
| Vds | 14.6 | 17.1 | Volts | 10 |

Vds represents the drain-to-source voltages across the device for the silicon prototype results. Vg represents voltage applied on the gate electrode. The HVNMOS transistor of a preferred embodiment of the current invention presents an increased on-breakdown voltage, compared to a prior art high voltage NMOS transistor of similar device dimensions.

Figure 10:
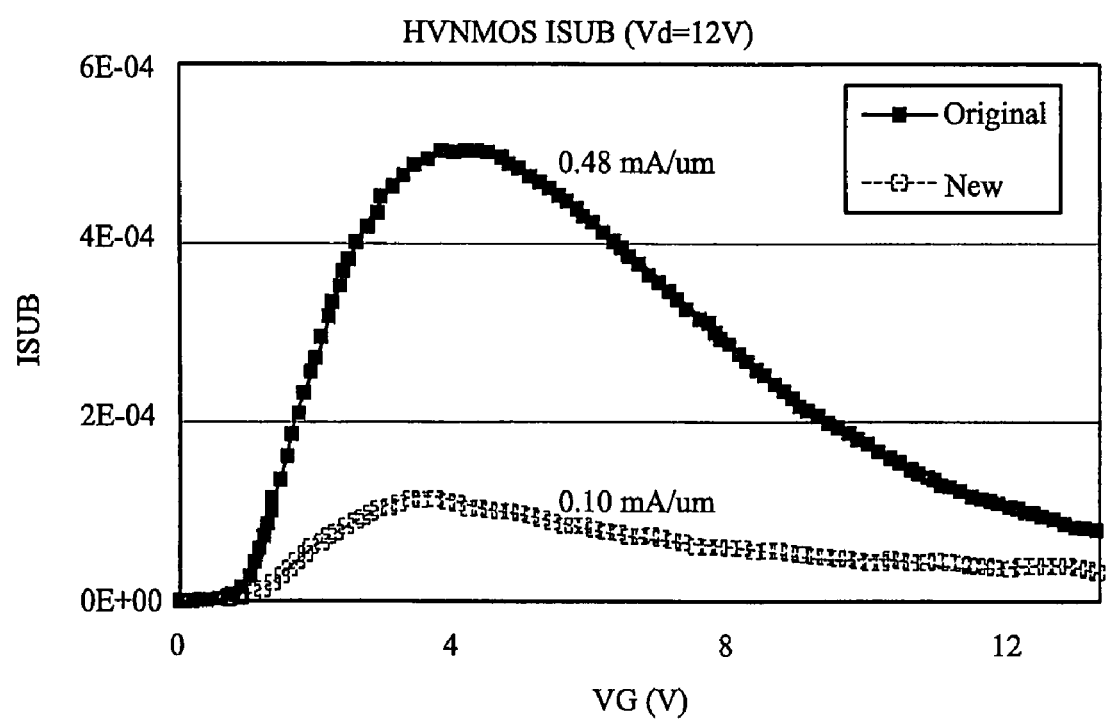
FIG. 10 compares the substrate current $Isub_{max}$ of a preferred embodiment of the current invention with that of a prior art high voltage NMOS transistor.

As will be appreciated by those skilled in the art, the substrate current $Isub_{max}$ is an important indicator to check MOS transistor's snapback breakdown. FIG. 10 demonstrates that $Isub_{max}$ in an HVNMOS transistor of a preferred embodiment of current invention was reduced by 78%, compared to a prior art high voltage NMOS transistor, which clearly indicates the effectiveness of this inventive structure on suppressing snapback breakdown.

Although the present invention and its advantages have been described in detail, it should be understood that various changes, substitutions and alterations can be made herein without departing from the spirit and scope of the invention as defined by the appended claims. For example, other transistor structures can be formed in accordance with the key principle of this invention, in which on-breakdown voltage of a MOS transistor can be improved by creating "road blocks" made of reverse impurity type in the source/drain region to increase the length of current path between source and drain region, which in turn, reduces the peak electric field in the device. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A MOS transistor comprising:
a semiconductor substrate of a first conductivity type;
a source region of a second conductivity type, opposite said first conductivity type and having a net impurity concentration higher than that of said substrate, disposed in a first surface portion of said substrate;
a drain region of said second conductivity type, disposed in a second surface portion of said substrate and comprising a relatively lightly doped region contiguous with a relatively heavily doped region;
a channel region, disposed in a third surface portion of said substrate separating said source region from said drain region;
a gate dielectric layer located on the surface of said substrate between said source and drain regions, said gate dielectric film overlying said channel region;
a gate electrode located upon said gate dielectric layer;
a plug region of said first conductivity type comprising a portion extending into said substrate, said portion being surrounded by said lightly doped region and contiguous with said heavily doped region, said heavily doped region extending into said substrate at least as far as said portion of said plug region, said plug region aligned with said gate dielectric and gate electrode.

2. The MOS transistor of claim 1 wherein said lightly doped region surrounds said heavily doped region, and extends into said substrate deeper than the depth of said heavily doped region.

3. The MOS transistor of claim 2 further comprising a spacer on a side wall of the gate electrode.

4. The MOS transistor of claim 3 wherein said plug region is beneath said spacer.

5. The MOS transistor of claim 4 wherein said lightly doped region is an N-type region with doping density from about $10^{12}$ cm$^{-2}$ to about $10^{13}$ cm$^{-2}$, said plug region is a P-type region with doping density from about $10^{13}$ cm$^{-2}$ to about $10^{14}$ cm$^{-2}$, and said heavily doped region is an N-type region with doping density from about $10^{14}$ cm$^{-2}$ to about $10^{16}$ cm$^{-2}$.

6. The MOS transistor of claim 5 wherein said lightly doped region extends to a depth from approximately 0.6 μm to approximately 1.5 μm, said plug region extends to a depth of approximately 0.5 μm, and said heavily doped region extends to a depth of approximately 0.6 μm.

7. The MOS transistor of claim 2 wherein said source region, said lightly doped region and said heavily doped region of said drain region comprise P-type dopants, said substrate comprises N-type dopants, and the MOS transistor is a PMOS transistor.

8. The MOS transistor of claim 1 wherein said lightly doped region is laterally offset from the heavily doped region and extends toward said source region.

9. The MOS transistor of claim 8 further comprising a spacer on a side wall of the gate electrode.

10. The MOS transistor of claim 9 wherein said plug region is beneath said spacer.

11. The MOS transistor of claim 10 wherein said lightly doped region is an N-type region with doping density from about $10^{12}$ cm$^{-2}$ to about $10^{13}$ cm$^{-2}$, said plug region is a P-type region with doping density from about $10^{13}$ cm$^{-2}$ to about $10^{14}$ cm$^{-2}$, and said heavily doped region is an N-type region with doping density from about $10^{14}$ cm$^{-2}$ to about $10^{16}$ cm$^{-2}$.

12. The MOS transistor of claim 11 wherein said lightly doped region extends to a depth from approximately 0.6 μm to approximately 1.5 μm, said plug region extends to a depth of approximately 0.5 μm, and said heavily doped region extends to a depth of approximately 0.6 μm.

13. The MOS transistor of claim 8 wherein said source region, said lightly doped region and said heavily doped region comprise P-type dopants, said substrate comprises N-type dopants, and the MOS transistor is a PMOS transistor.

14. A MOS transistor comprising:
a substrate comprising an insulating material;
a semiconductor layer of a first conductivity type disposed over said insulating material;

a source region of a second conductivity type, opposite said first conductivity type and having a net impurity concentration higher than that of said semiconductor layer, disposed in a first surface portion of said semiconductor layer and being contiguous with said substrate;

a drain region of said second conductivity type, disposed in a second surface portion of said semiconductor layer and comprising a relatively lightly doped region contiguous with a relatively heavily doped region, said lightly doped region is laterally offset from the heavily doped region and extends toward said source region, said heavily doped region being contiguous with said substrate;

a channel region, disposed in a third surface portion of said semiconductor layer separating said source region from said drain region;

a gate dielectric layer located on the surface of said semiconductor layer between said source and drain regions, said gate dielectric film overlying said channel region;

a gate electrode located upon said gate dielectric layer;

spacers located on opposing sidewalls of the gate dielectric and gate electrode; and a plug region of said first conductivity type comprising a portion extending into said semiconductor layer, said portion being surrounded by said lightly doped region and contiguous with said heavily doped region, said heavily doped region being at least as deep as said portion of said plug region, wherein said plug region extends along the surface of said semiconductor layer no further from the gate dielectric than the spacers.

15. The MOS transistor of claim 14 wherein said source region, said lightly doped region and said heavily doped region of said drain region comprise N-type dopants, said substrate comprises P-type dopants, and the MOS transistor is a NMOS transistor.

16. The MOS transistor of claim 14 wherein said source region, said lightly doped region and said heavily doped region of said drain region comprise P-type dopants, said substrate comprises N-type dopants, and the MOS transistor is a PMOS transistor.

17. The MOS transistor of claim 14 wherein said insulating material is selected from the group consisting of silicon dioxide, sapphire, and the like.

18. A high voltage MOS transistor comprising:
a substrate of a first conductivity type;
a source region of a second conductivity type, opposite said first conductivity type and having a net impurity concentration higher than that of said substrate, disposed in a first surface portion of said substrate;
a drain region of said second conductivity type, disposed in a second surface portion of said substrate and comprising a relatively heavily doped region surrounded by a relatively lightly doped region;
a channel region, disposed in a third surface portion of said substrate separating said source region from said drain region;
a gate dielectric layer located on the surface of said substrate between said source and drain regions, said gate dielectric film overlying said channel region;
a gate electrode located upon said gate dielectric layer;
a plug region of said first conductivity type comprising a portion extending into said substrate, said portion being surrounded by said lightly doped region and contiguous with said heavily doped region, said heavily doped region extending into said substrate in a direction perpendicular to a major surface of said substrate at least as far as said plug region; and
a contact in physical connection with a portion of said relatively heavily doped region, the portion having the second conductivity type.

19. The high voltage MOS transistor of claim 18 wherein said substrate is a bulky semiconductor material.

20. The high voltage MOS transistor of claim 18 wherein said substrate comprises a semiconductor layer formed on an insulating material selected from the group consisting of silicon dioxide, sapphire, and the like.

21. A MOS transistor comprising:
a semiconductor substrate of a first conductivity type;
a source region of a second conductivity type, opposite said first conductivity type and having a net impurity concentration higher than that of said substrate, disposed in a first surface portion of said substrate;
a drain region of said second conductivity type, disposed in a second surface portion of said substrate and comprising a relatively lightly doped region contiguous with a relatively heavily doped region;
a channel region, disposed in a third surface portion of said substrate separating said source region from said drain region;
a gate dielectric layer located on the surface of said substrate between said source and drain regions, said gate dielectric film overlying said channel region;
a gate electrode located upon said gate dielectric layer;
a plug region of said first conductivity type comprising a portion extending into said substrate, said portion being surrounded by said lightly doped region and contiguous with said heavily doped region, said heavily doped region extending into said substrate at least as far as said portion of said plug region; and
a contact laterally separated from the plug region and in connection with said heavily doped region.

* * * * *